United States Patent
Lu et al.

(10) Patent No.: US 7,358,538 B2
(45) Date of Patent: Apr. 15, 2008

(54) ORGANIC LIGHT-EMITTING DEVICES WITH MULTIPLE HOLE INJECTION LAYERS CONTAINING FULLERENE

(76) Inventors: Zheng-Hong Lu, 556 Davisville Avenue, Toronto (CA) M4S 1J5; Sijian Han, 3000 Victoria Park Ave, Apt 326, New York (CA) M2J 4Y2; Yanyan Yuan, 810-35 Charles Street, Toronto (CA) M5Y 1R6

( * ) Notice: Subject to any disclaimer, the term of this patent is extended or adjusted under 35 U.S.C. 154(b) by 99 days.

(21) Appl. No.: 11/260,469

(22) Filed: Oct. 28, 2005

(65) Prior Publication Data

US 2006/0251924 A1    Nov. 9, 2006

Related U.S. Application Data

(60) Provisional application No. 60/622,696, filed on Oct. 28, 2004.

(51) Int. Cl.
  *H01L 29/225* (2006.01)
  *H01L 33/00* (2006.01)
(52) U.S. Cl. .................. 257/97; 257/40; 257/103; 257/E21.007; 438/22; 438/23; 438/34; 438/46; 438/99
(58) Field of Classification Search ............ 438/22–23, 438/34, 46, 99; 257/40, 97, 103, E21.007
See application file for complete search history.

(56) References Cited

U.S. PATENT DOCUMENTS 4,356,429 A    10/1982  Tang 5,908,581 A  *  6/1999  Chen et al. ............ 252/301.16
6,139,999 A  *  10/2000  Fuller et al. ............. 430/58.65
2001/0011868 A1*  8/2001  Fukunaga et al. .......... 313/506

(Continued)

FOREIGN PATENT DOCUMENTS

JP           7-161476          6/1995

(Continued)

OTHER PUBLICATIONS

Moerner, W.E., Grunnet-Jepsen, A., Wright, D., Casperson, J., Glazer, E., DeClue. M., Siegel, J.S., Twieg, R.J. *Understanding trapping in photorefractive polymer composites for optical processing applications.* QELS, Thursday Morning, pp. 186-187. 1999.

*Primary Examiner*—Michelle Estrada
*Assistant Examiner*—Jarrett J Stark
(74) *Attorney, Agent, or Firm*—Lynn Schumacher; Hill & Schumacher

(57) ABSTRACT

The present invention provides layered hole injection structures including one or more layers of fullerenes for application in an organic electroluminescent device. The layered structures include a bi-layered structure including an electrically conductive layer serving as electrical contact to external circuit and a fullerene layer sandwiched between the conductive layer and a hole transport layer. The layered structure may also includes a tri-layered structure stacked sequentially including a first electrically conductive layer, a fullerene layer and a hole injection layer material selected from thermally stable molecules such as CuPc. The layered structure may also include a four-layered structure stacked sequentially including a first electrically conductive layer, a fullerene layer on the conductive layer, a noble metal layer on the fullerene layer and another fullerene layer on the noble metal layer.

28 Claims, 15 Drawing Sheets

U.S. PATENT DOCUMENTS

| | | | |
|---|---|---|---|
| 2001/0041270 A1* | 11/2001 | Maruyama et al. | 428/690 |
| 2001/0043046 A1* | 11/2001 | Fukunaga | 315/160 |
| 2002/0021088 A1* | 2/2002 | Howard et al. | 313/504 |
| 2002/0030193 A1* | 3/2002 | Yamazaki et al. | 257/98 |
| 2002/0057050 A1* | 5/2002 | Shi | 313/504 |
| 2002/0195929 A1* | 12/2002 | Haase et al. | 313/504 |
| 2003/0048072 A1* | 3/2003 | Ishihara et al. | 313/506 |
| 2004/0214041 A1 | 10/2004 | Lu et al. | |

FOREIGN PATENT DOCUMENTS

| | | |
|---|---|---|
| JP | 2002-313582 | 10/2002 |
| TW | 588572 | 5/2004 |

* cited by examiner

ORGANIC LIGHT-EMITTING DEVICES WITH MULTIPLE HOLE INJECTION LAYERS CONTAINING FULLERENE

CROSS REFERENCE TO RELATED U.S APPLICATION

This patent application relates to, and claims the priority benefit from, U.S. Provisional Patent Application Ser. No. 60/622,696 filed on Oct. 28, 2004, which is incorporated herein by reference in its entirety.

FIELD OF THE INVENTION

The present invention relates to organic-based light-emitting devices (OLEDs) and more particularly the present invention relates to hybrid electroluminescence devices in which a fullerene containing multilayered hole injection structure containing fullerenes is used to inject holes into the electroluminescent layer of the OLEDs.

BACKGROUND OF THE INVENTION

A typical organic light-emitting device includes a hole injection anode layer, an active light-emitting zone comprising one or more electroluminescent organic material(s), and a cathode. One of the electrodes is optically transmissive while the other one is optically reflective. The function of the anode layer is to inject positively charged particles, referred to as holes, into the light-emitting zone, and that of the cathode is to inject electrons into the emission zone. A process involved in the recombination of the electrons and the holes leads to the creation of light wave. The light wave is escaped through one of the aforementioned electrodes.

U.S. Pat. No. 4,356,429 discloses inserting a hole-transport organic layer between the anode and the emission zone, and an electron-transport organic layer between the cathode and the emission zone.

As molecules are perfectly structured so that there is no "intrinsic" charge, i.e. extra charge, in the molecules. All charges have to be injected from the electrodes during device operation. It is well known that regulated hole injection is critical to OLED device performance (Shih-Fang Chen and Ching-Wu Wang, Applied Physics Letters Vol. 85, 765 (2004)). A great amount of work has been conducted to find suitable hole injection method.

U.S. Pat. No. 4,539,507 disclose a hole injection zone to improve power conversion efficiency. United States Patent Pub. No. US2003/0117069 A1 discloses the use of crystalline CuPc film as a hole injection layer. U.S. Pat. No. 6,208,077 B1 discloses the use of a thin non-conductive fluorocarbon polymer film in the hole injection zone. U.S. Pat. No. 6,198,218 B1 discloses the use of diamond film as a hole injection layer. U.S. Pat. No. 5,710,484 discloses the use of sputtered carbon film as a hole injection layer. The use of small organic molecular film as a hole injection layer can be found in the following patents: U.S. Pat. No. 5,998,803; PCT patent WO 2004/068912 A1; US patent pub. No. 2003/0015723 A1; PCT patent No. WO96/22273.

As a family member of naturally occurring allotropes of carbon, fullerene materials are known for their robust structures and superior charge transport properties. U.S. Pat. No. 5,861,219 discloses the use of fullerenes as a dopant added to a host metal complex of 5-hydroxy-quinoxaline used in organic light emitting diodes. The host metal complex of 5-hydroxy-quinoxaline is contained in the electroluminescent layer which forms the emission zone in the structure. United States Patent Publication US 2002/0093006 A1 discloses the use of a fullerene layer as the light emissive layer in an organic light emitting diode structure.

United States Patent Publication US 2003/0042846 A1 discloses the use of a fullerene layer as an electron acceptor layer in organic photovoltaic devices.

Japan Patent 3227784 and Japanese patent application 04-144479 disclose the use of fullerenes as a hole transport layer.

U.S. patent application Ser. No. 10/811,153 discloses the use of fullerenes in an electron transport layer.

U.S. Pat. No. 5,171,373 discloses the use of fullerenes in solar cells. U.S. Pat. No. 5,759,725 discloses the use of fullerenes in photoconductors.

The use of fullerenes as a hole blocking interface layer between the hole transport layer and the light emission layer has been disclosed by Keizo Kato, Keisuke Suzuki, Kazunari Shinbo, Futao Kaneko, Nozomu Tsuboi, Satosh Kobayashi, Toyoyasu Tadokoro, and Shinichi Ohta, Jpn. J. Appl. Phys. Vol. 42, 2526 (2003).

SUMMARY OF THE INVENTION

The present invention provides organic-based electroluminescence devices in which a fullerene containing multilayered film structure is incorporated to provide efficient hole injection into a hole transport layer of an organic light emitting device. The purpose of these multi-layered film structures are to provide controlled hole injection into the hole transport layer through the selection of energy matched layers, and to provide better mechanical adhesion between organic layer and inorganic conducting electrode.

Thus, the present invention provides a light-emitting device comprising a substrate, a hole injection structure including an electrically conductive layer defining an anode on the substrate and a first hole injection layer comprising fullerenes on the electrically conductive layer and a second hole injection layer comprising a metal on the first hole injection layer and a third hole injection layer located on the second hole injection layer comprising fullerenes. The device includes a hole transport layer on the third hole injection layer, a layer of electroluminescent material on the hole transport layer, an electron transport layer on the electroluminescent layer, and an electrically conductive layer defining a cathode electrode layer on the electron transport layer.

In this embodiment the metal may be a high work function noble metal.

In an alternative embodiment, there is provided a light-emitting device light-emitting device with a hole injection structure, comprising a substrate; a hole injection structure including an electrically conductive layer defining an anode on the substrate; a first hole injection layer comprising fullerenes on the electrically conductive layer; a second hole injection layer comprising a layer of organic molecules located between the first hole injection layer and the hole transport layer; a hole transport layer on the first hole injection layer; a layer of an electroluminescent material on the hole transport layer; an electron transport layer on the layer of an electroluminescent material; and an electrically conductive layer defining a cathode electrode layer on the electron transport layer.

These light-emitting devices may include an interfacial layer interposed between the hole injection layers and the hole transport layer with the interfacial layer comprising a metal phthalocynine compound having a thickness from about 1 nm to about 40 nm.

BRIEF DESCRIPTION OF THE DRAWINGS

The layered structure and the light-emitting device produced according to the present invention will now be described, by way of example only, reference being made to the accompanying drawings, in which.

DETAILED DESCRIPTION OF THE INVENTION

Definitions

As used herein, the phrase "hole injection structure" means a layered thin-film structure having a primary function of injection of holes into a hole transport layer adjacent to the hole-injection structure.

As used herein, the phrase "hole transport material" means a material having a primary function to conduct holes across the material from one region (or side) to another region (or side in the case in the case of a layer).

As used herein, the phrase "electroluminescent material" or "light emissive material" or "light-emission material" means a material having the primary function of emitting light under electrical stimulation.

As used herein, the term "fullerene" means nanostructured carbon consisting of 60, 70, or more carbon atoms self-bonded in spherical forms which are also referred to as Buckminster fullerenes, nano bucky balls (NBB) or bucky balls (BB) in the literature. The carbon atoms may be bonded to additional atoms or functional groups.

ELECTROLUMINESCENT DEVICE EXAMPLE 1

Figure 1:
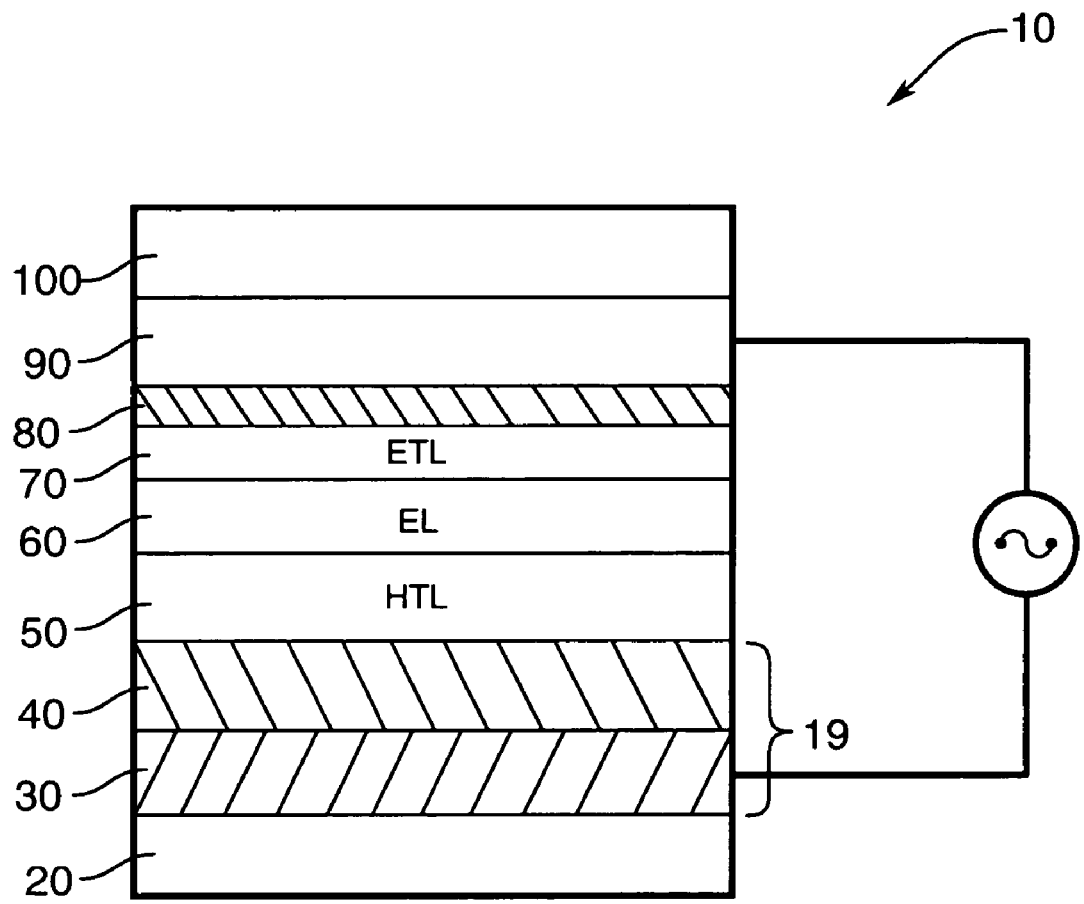
FIG. 1 is a sectional view of a light-emitting device having a bi-layered hole injection structure produced in accordance with the present invention.

Referring to FIG. 1, an EL device 10 has been constructed showing the integration of a bi-layered fullerene-containing hole injection structure into a typical small organic molecule based device of the type disclosed in U.S. Pat. No. 4,356,429 and U.S. patent application Ser. No. 10/811,153. The device 10 comprises an electrically passive film or a substrate 20, bi-layer hole injection structure 19 which includes a first conductive anode layer 30 located on substrate 20 and a second layer 40 located on layer 30. The device includes a hole transport layer 50 on layer 40, a light emissive or light-emission layer 60 on layer 50 capable of emitting light formed on the hole transport layer 50, an electron transport layer 70 on the light-emission layer 60, an outer conductive cathode layer 90 and an interfacial contact layer 80 sandwiched between electron transport layer 70 and cathode layer 90 which makes Ohmic contact with fullerene electron transport layer 70 and cathode layer 90. An electrically passive film or a substrate layer 100 is on top of cathode-layer 90.

A power supply is connected across the anode electrode layer 130 and the cathode electrode layer 190 for applying a voltage across the layered device so that when the threshold voltage is applied, holes are injected from hole emitting structure 119 through hole transport layer 150 and into EL layer 160 where they recombine with electrons emitted from cathode layer 190 through ETL 170, thereby emitting light from EL 160.

Layer 20 may be a glass substrate or alternatively it could be made of any material capable of providing mechanical support to thin films. It could be coated with functional thin-film transistors which may be used as electrical drivers. Layer 20 may be optically transparent to light emitted from the light emissive layer. Alternatively, layers 80, 90 and 100 may be made of suitable materials and thickness to ensure light is coupled out of the light emissive layer 60 through these layers.

Conductive anode layer 30 is connected to the external bias potential for hole injection when a positive bias is applied and it may be made, for example, of ITO. Electrode layer 30 may also be any other metal or alloy with a high work function. For example, anode layer 30 may be selected from high work function conducting materials including $SnO_2$, Ni, Cr, Ag, Pt, Au, p++ semiconductors (c-Si, a-Si, a-Si:H, poly-silicon).

Layer 40 is a layer of fullerenes with a preferred thickness 1-10 nm. It may be C60, C70, higher fullerene and a mixture thereof.

Hole transport layer (HTL) 50 is preferably an organic-based layer and maybe NPB which is commonly used as the HTL, and may have a thickness of about, but not limited to, 50 nm. It could also be any other one or more layers of organic or polymer materials capable of transporting holes and having a thickness range from about 10 nm to about 300 nm. The hole-transport layer 50 may be comprised of those materials disclosed in United States Patent Publication No. 20020180349 which is Ser. No. 10/117,812 published Dec. 5, 2002 which is incorporated herein by reference in its entirety, which application refers to U.S. Pat. Nos. 4,539,507; 5,151,629; 5,150,006; 5,141,671 and 5,846,666 which are all incorporated herein by reference in their entirety. This reference discloses different hole transport layer materials, electron transport layer materials, anode materials and cathode materials, which application refers to U.S. Pat. Nos. 4,539,507, 5,942,340 and 5,952,115 which are all incorporated herein by reference in their entirety.

Electroluminescent or light-emission layer 60 may be an organic electroluminescence layer comprised of, for example, tris-(8-hydroxyquinoline) aluminum (Alq) and may have a thickness of 25 nm. It could also be a layer of an organic compound capable of emitting different colors and having a thickness in the range from about 10 nm to about 100 nm. Other suitable materials useful for the light emission-layer include conjugated polymers such as poly (paraphenylene vinylene) (PPV); various members of PPV with and without pigment dyes such as disclosed in U.S. Pat. Nos. 5,294,869 and 5,151,629; rare earth metal, actinide or transition metal organic complex as disclosed in U.S. Pat. No. 6,524,727, all being incorporated herein by reference.

The active electroluminescent layer 60 region can also include one or more layers comprising any one or a mixture of two or more of fluorescent and phosphorescent materials including small molecules and polymers. For example, the active light-emission layer 60 may be comprised of those materials disclosed in United States Patent publication 20020180349. U.S. patent application Ser. Nos. 08/829,398; 09/489,144 and U.S. Pat. No. 6,057,048 also disclose materials which may be used for the light-emission layer and these references are incorporated herein in their entirety.

Electron transport layer 70 is preferably comprised of the fullerene compound C60 and has a thickness range from about 1 nm to about 300 nm, and more preferably from about 5 nm to 50 nm. It may be selected from other electron transport materials such as small organic molecule Alq.

The interfacial layer 80 which makes contact with electron transport layer 70 is preferably made of a bi-layer of 2 nm LiF and Al. However, it will be appreciated by those skilled in the art that it could be any fluoride provided it is in direct contact with the electron transport layer. The interfacial layer 80 may be made using any low work function metals and alloys or mixtures such as Ca, Mg, Mg:Ag and Li:Al to mention just a few.

Cathode layer 90 is preferably aluminum (Al) and that which has a thickness of 100 nm has shown good behavior but other thickness may certainly be used. In addition, cathode 90 may be made of one or more layers of other well known conductive metals and/or alloys. For example, cathode 90 may be produced from one or more layers of highly conductive metals and alloys such as ITO, Al, Cr, Cu, Ag, Au, Ni, Fe, Ni, W, Mo, Co, Mg:Ag, Li:Al. Layer 100 may be a substrate or a cathode capping layer 100 made of a dielectric, such as Si oxides and nitrides, may be deposited on the cathode by sputtering or any of the other coating techniques known to those skilled in the art.

Figure 3:
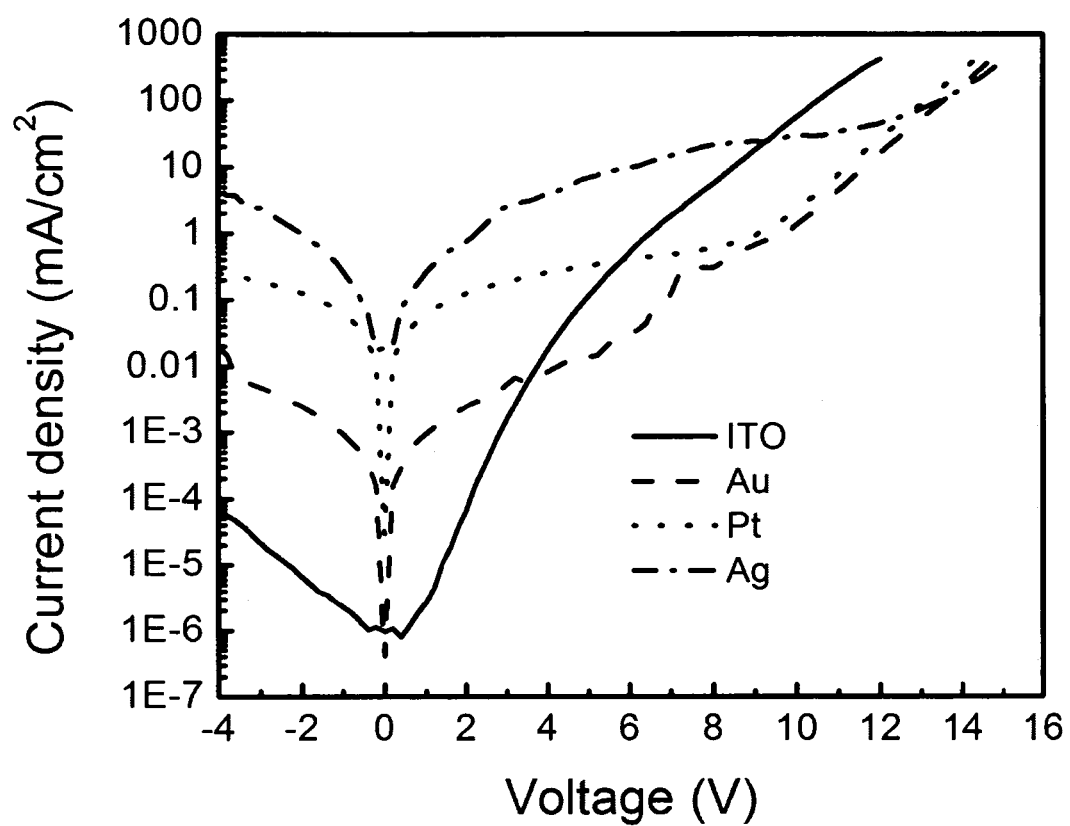
FIG. 3 shows plots of current versus voltage characteristics for hybrid organic EL devices of FIG. 1 with four different electrically conductive anode layers.
Figure 4:
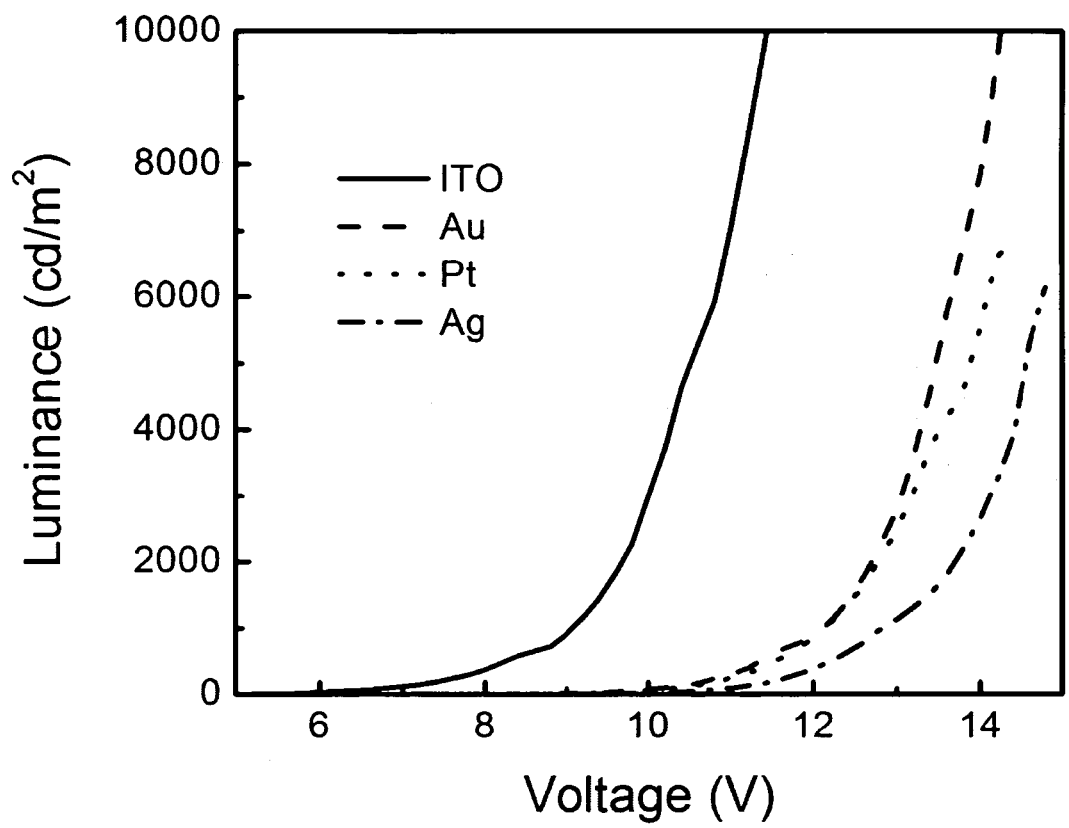
FIG. 4 shows plots of luminance versus voltage characteristics of hybrid organic EL devices of FIG. 1 with four different electrically conductive anode layers.

The present invention provides a hybrid light-emitting device which uses a fullerene-containing bi-layer hole injection structure (30, 40) provides for robust for hole injection. Shown in FIG. 3 are current versus voltage characteristics and in FIG. 4 are luminance versus voltage characteristics of various OLED having a structure stacking sequentially: Substrate/conductive anode layer/C60 (3 nm)/NPB (60 nm)/Alq (25 nm)/C60 (15 nm)/LiF(1 nm)/Al(100 nm). Here four conductive anode films were selected; indium-tin-oxides (ITO) (120 nm), and the same ITO coated with 3 nm thick Au, Pt, and Ag respectively. As hole transport from anode layer 30 to the fullerene layer containing C60 layer is determined by the surface work function of the layer, we consider the 3 nm thick metal as an individual functional conductive anode layer.

ELECTROLUMINESCENT DEVICE EXAMPLE 2

Figure 2:
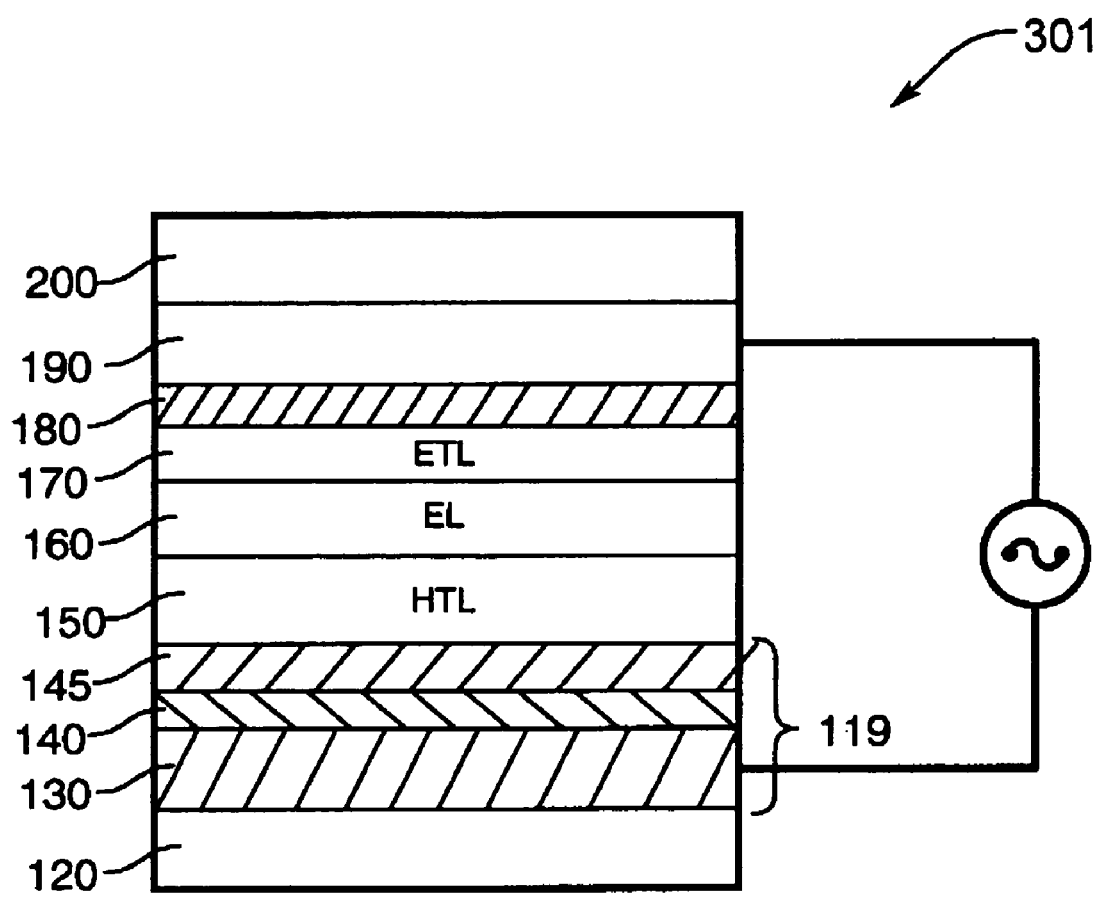
FIG. 2 is a sectional view of a light-emitting device having a tri-layered hole injection structure produced in accordance with the present invention.

Referring to FIG. 2, an EL device 301 has been constructed to integrate a tri-layered fullerene containing hole injection structure into a typical small organic molecule based device of the type disclosed in U.S. Pat. No. 4,356,429 and U.S. patent application Ser. No. 10/811,153. The device 301 includes an electrically passive film or a substrate 120, a tri-layer hole injection structure 119 which includes three layers 130/140/145 inclusive, a hole transport layer 150, a light emissive (EL) or light-emission layer 160 capable of emitting light formed on the hole transport layer 150, an electron transport layer 170 on the light-emission electroluminescent layer 160, an outer conductive cathode layer 190 and an interfacial contact layer 180 sandwiched between electron transport layer 170 and cathode layer 190 which makes Ohmic contact with fullerene electron transport layer 170 and cathode layer 190. Layer 200 could be an electrically passive film or a substrate.

Substrate 120 may be a glass or alternatively it could be made of any material capable of providing mechanical support to thin films. It could be coated with functional thin-film transistors which may be used as electrical drivers. Substrate 120 may be optically transparent for light emitted from the light emissive layer. Alternatively, layers 180, 190 and 200 may be made of suitable materials and thickness to ensure light is coupled out of the light emissive layer 160 through these layers.

Conductive anode layer 130 is connected to external circuit for hole injection when a positive bias is applied and it may be, for example, of ITO. Electrode layer 130 may also be any other metal or alloy with a high work function. For example, anode layer 130 may be selected from high work function conducting materials including $SnO_2$, Ni, Cr, Ag, Pt, Au, p++ semiconductors (c-Si, a-Si, a-Si:H, poly-silicon).

Layer 140 is fullerene layer with a preferred thickness 1-10 nm. It may be C60, C70, higher fullerene or a mixture thereof.

Layer 145 is an organic molecule-based matching layer and has a preferred thickness 10-40 nm. It may be CuPc. It may be selected from an organic molecule with glass transition temperature higher than 70° C. and a highest occupied molecular orbital (HOMO) energy between 4.5 eV and 6.5 eV. This organic molecule-base hole injection layer may be made of conducting polymers.

Hole transport layer (HTL) 150 is preferably an organic-based layer and may be NPB which is commonly used as the HTL, and may have a thickness of about, but not limited to, 50 nm. It could also be any other one or more layers of organic or polymer materials capable of transporting holes and having a thickness range from about 10 nm to about 300 nm discussed above with respect to device 10 in FIG. 1.

Electroluminescent layer 160 may be an organic electroluminescence layer comprised of, for example, tris-(8-hydroxyquinoline) aluminum (Alq) and may have a thickness of 25 nm. The active light-emission layer 160 region can also include one or more layers containing one or a mixture of two or more of fluorescent and phosphorescent materials including small molecules and polymers and may include any of the materials discussed above with respect to the layer 60 in device 10 of FIG. 1.

Electron transport layer 170 is preferably comprised of the fullerene compound C60 and has a thickness range from about 1 nm to about 300 nm, and more preferably from about 5 nm to 50 nm. It may be selected from other electron transport materials such as small organic molecule Alq.

The interfacial layer 180 which makes contact with electron transport layer 170 is preferably made of a bi-layer of 1 nm LiF and Al. However, it will be appreciated by those skilled in the art that it could be any fluoride provided it is in direct contact with the electron transport layer 170. The interfacial layer 180 may be made using any low work function metals and alloys or mixtures such as Ca, Mg, Mg:Ag and Li:Al to mention just a few.

Cathode layer 190 is preferably aluminum (Al) and that which has a thickness of 100 nm has shown good behavior but other thickness may certainly be used. In addition, cathode 190 may be made of one or more layers of other well known conductive metals and/or alloys, for example, any of the materials disclosed above for the cathode layer 90 of device 10 shown in FIG. 1.

The present invention provides a hybrid light-emitting device which uses a fullerene-containing tri-layer hole injection structure for hole injection.

Figure 5:
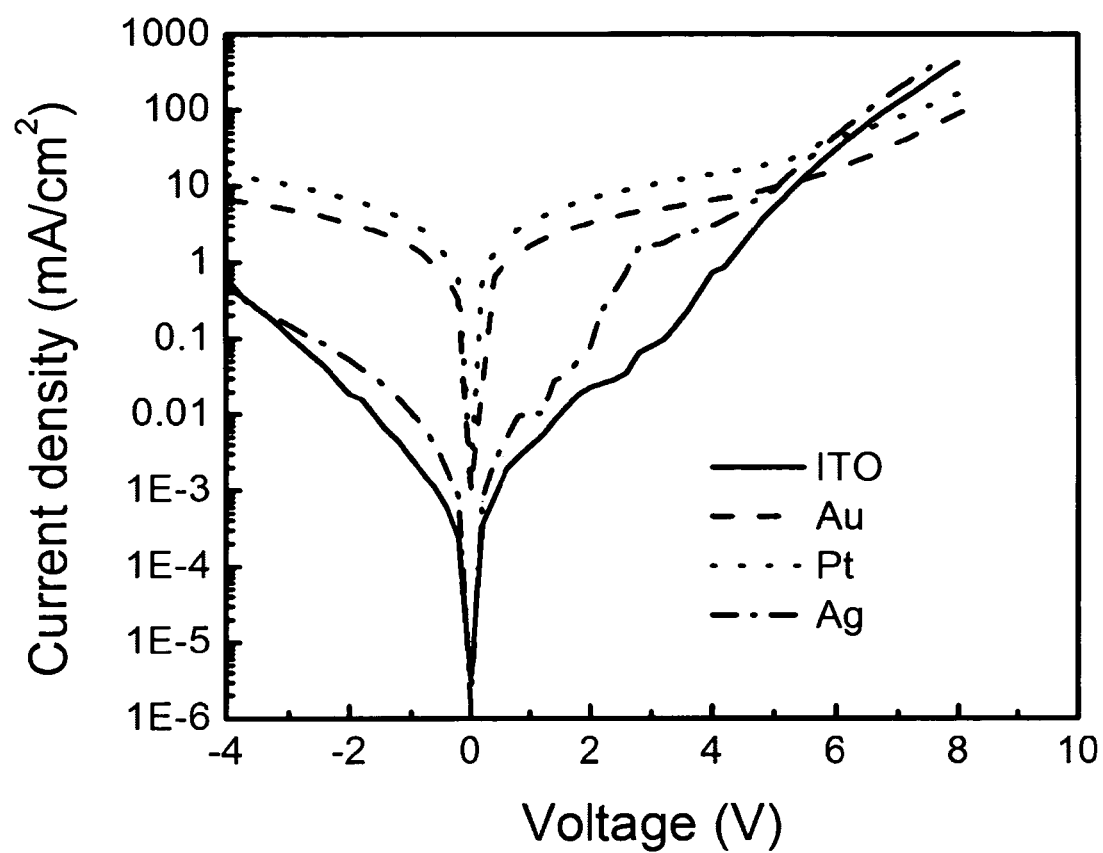
FIG. 5 shows plots of current versus voltage characteristics for hybrid organic EL devices of FIG. 2 with four different electrically conductive anode layers.
Figure 6:
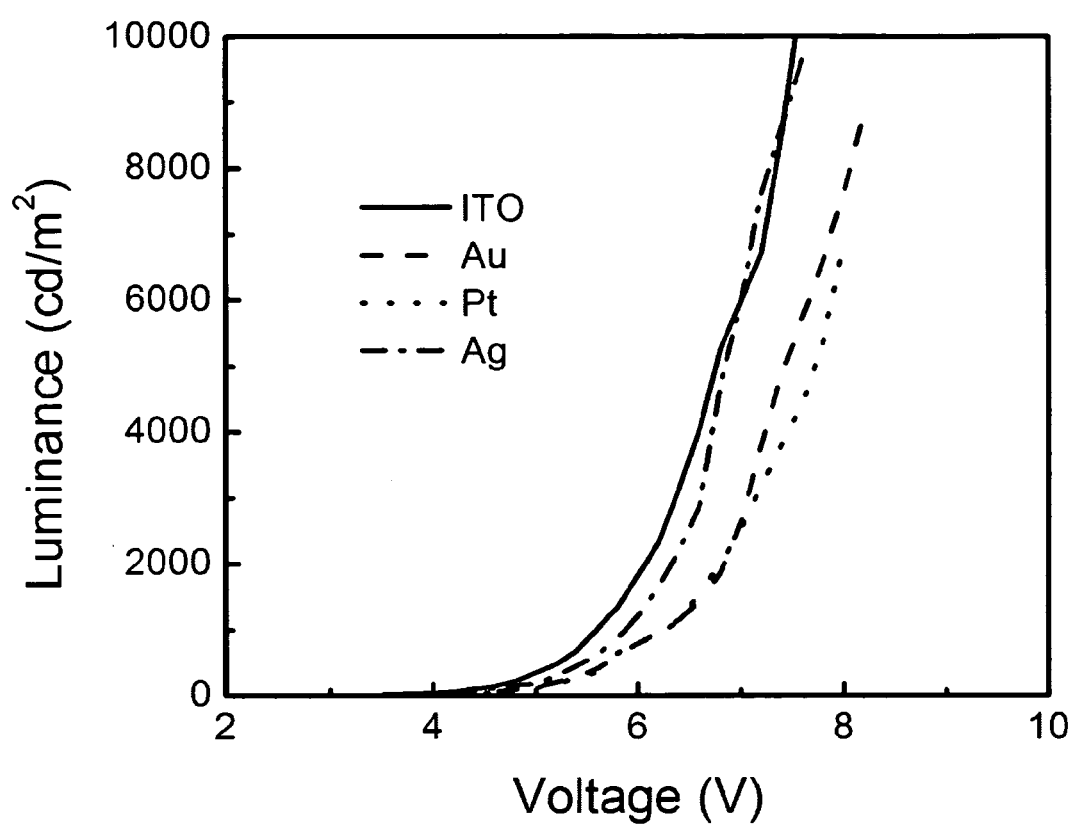
FIG. 6 shows plots of luminance versus voltage characteristics of hybrid organic EL devices of FIG. 2 with four different electrically conductive anode layers.

Shown in FIG. 5 are current vs voltage characteristics and in FIG. 6 are luminance vs voltage characteristics of various OLED having a structure stacking sequentially: Substrate/conductive anode layer/C60 (3 nm)/CuPc(15)/NPB (45 nm)/Alq (25 nm)/C60 (15 nm)/LiF(1 nm)/Al(100 nm). Here four conductive anode films were selected; indium-tin-oxides (ITO) (120 nm), and the same ITO coated with 3 nm thick Au, Pt, and Ag respectively. As hole transport from anode layer 130 to C60 layer 140 is determined by the surface work function of the layer 130, we consider the 3 nm thick metal as an individual functional conductive anode layer 130.

Figure 7:
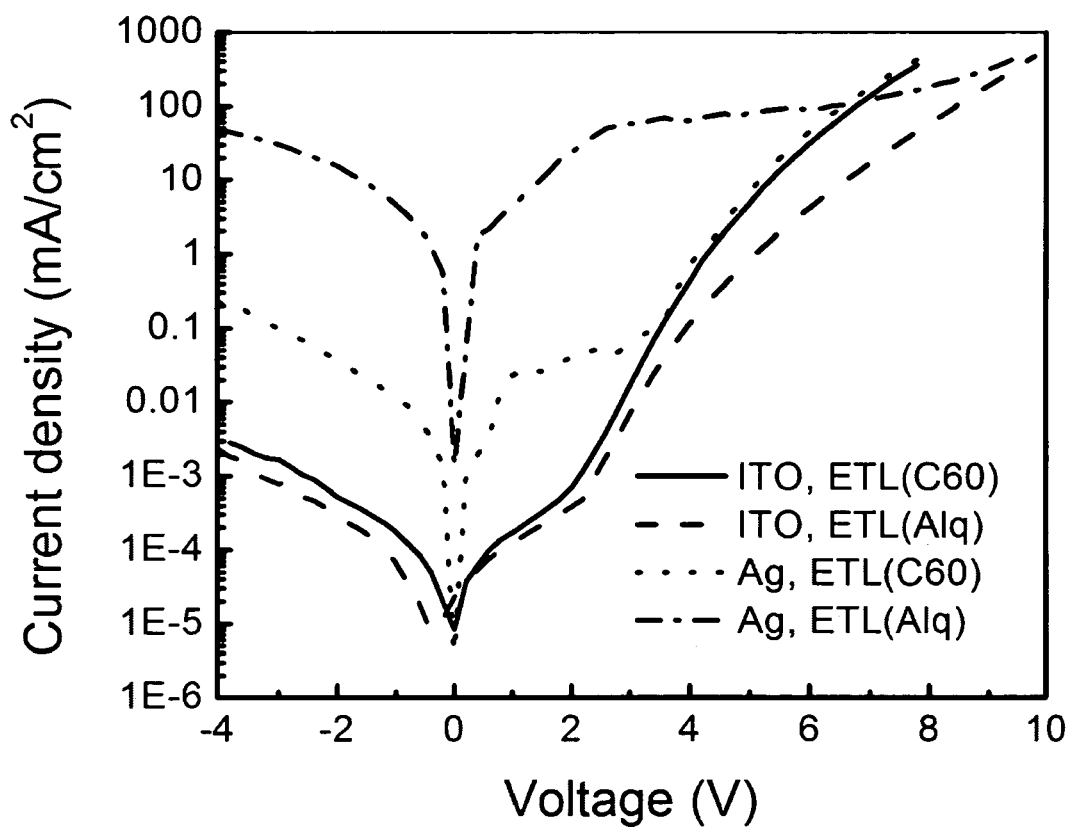
FIG. 7 shows plots of current versus voltage characteristics for hybrid organic EL devices of FIG. 2 having two different electrically conductive anode layers (ITO and Ag) and two different electron transport layers (Alq and C60)
Figure 8:
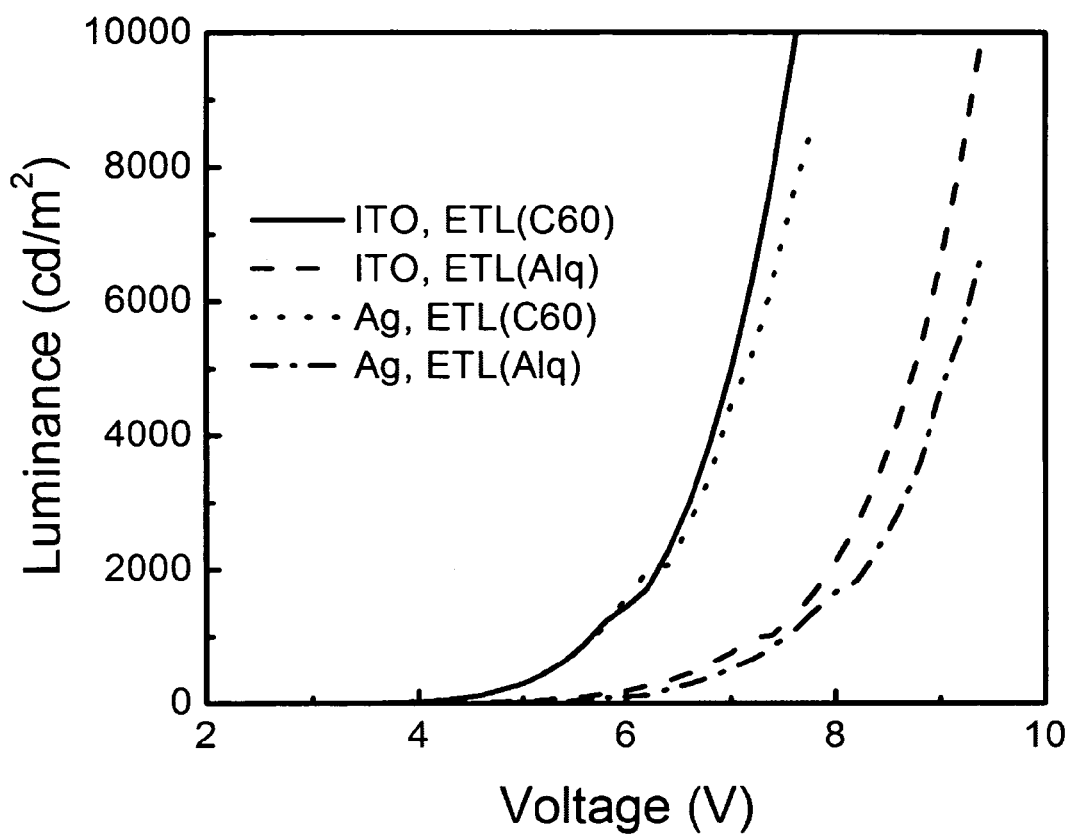
FIG. 8 shows plots of luminance versus voltage characteristics of hybrid organic EL devices of FIG. 2 having two different electrically conductive anode layers (ITO and Ag) and two different electron transport layers (Alq and C60)

Shown in FIG. 7 are current vs voltage characteristics and in FIG. 8 are luminance vs voltage characteristics of various OLED's having a structure stacking sequentially: Substrate/conductive anode layer/C60 (3 nm)/CuPc(15)/NPB (45 nm)/Alq (25 nm)/ETL (15 nm)/LiF(1 nm)/Al(100 nm). Here two conductive anode films were selected; indium-tin-oxides (ITO) (120 nm), and the same ITO coated with 3 nm thick Ag. As hole transport from a anode layer to C60 layer is determined by the surface work function of the layer, we consider the 3 nm thick metal as an individual functional conductive anode layer. The 15 nm thick ETL was selected from C60 and Alq, respectively.

Figure 9:
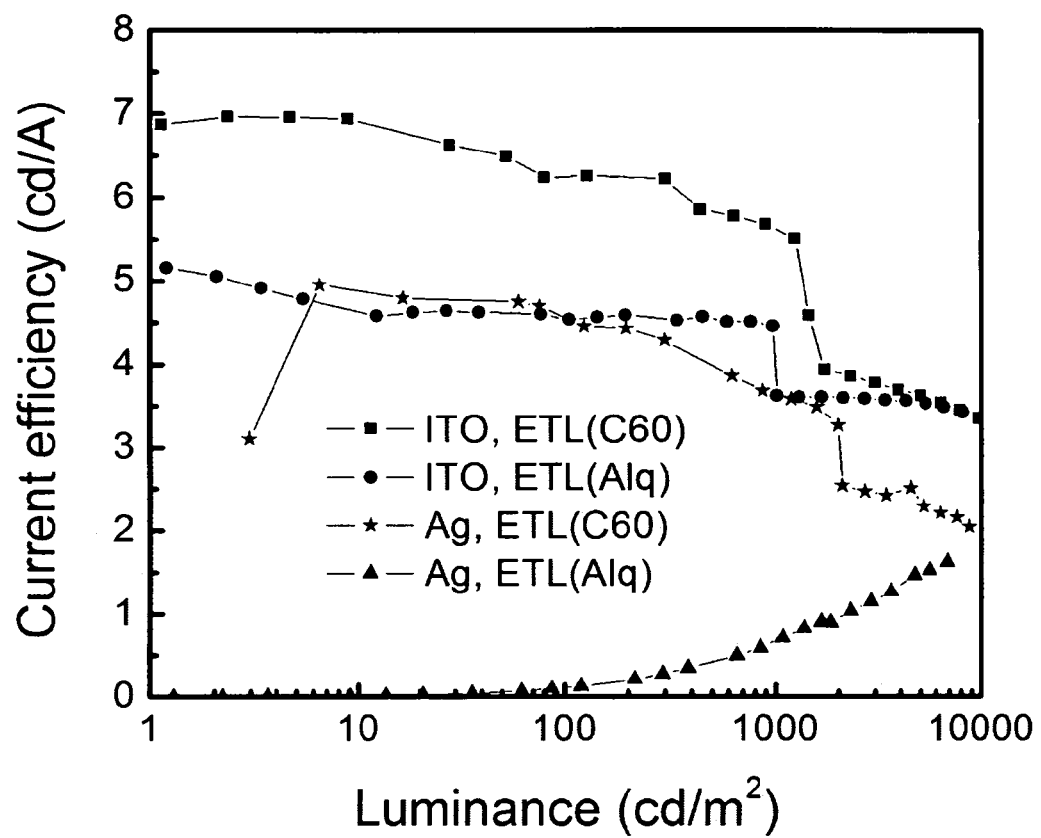
FIG. 9 shows plots of current efficiency versus luminance characteristics of hybrid organic EL devices of FIG. 2 having two different electrically conductive anode layers (ITO and Ag) and two different electron transport layers (Alq and C60)
Figure 10:
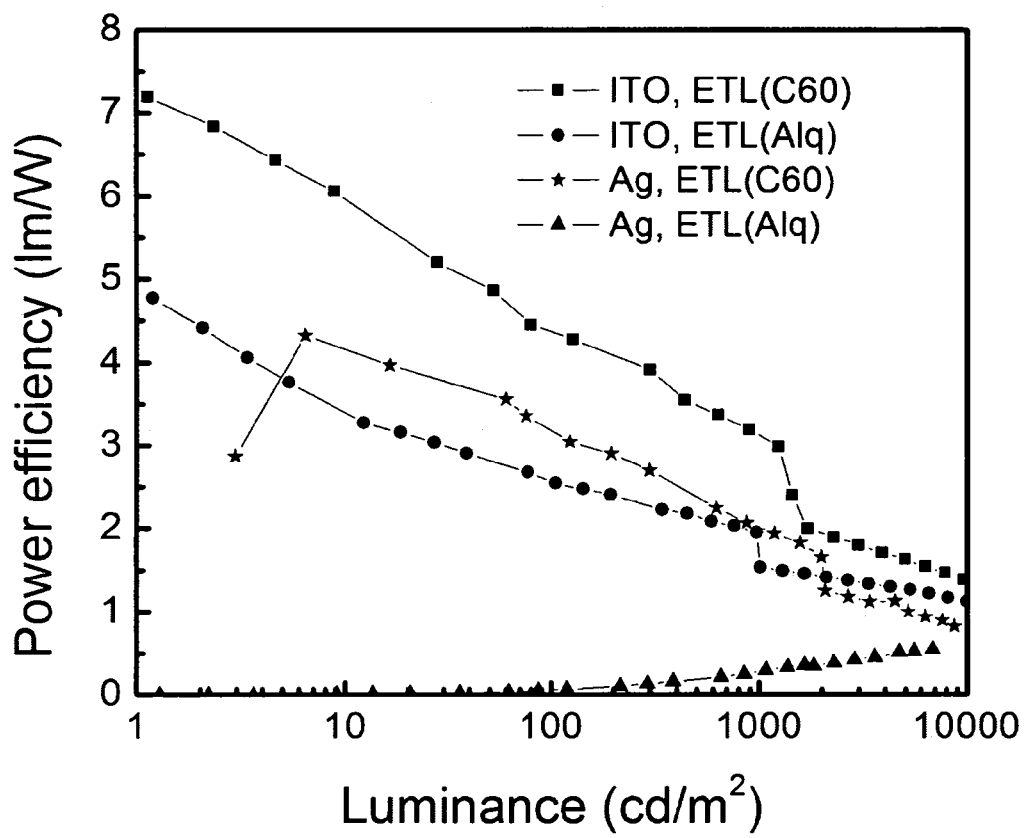
FIG. 10 shows plots of power efficiency versus luminance characteristics of hybrid organic EL devices of FIG. 2 having two different electrically conductive anode layers (ITO and Ag) and two different electron transport layers (Alq and C60)

Shown in FIG. 9 are current efficiency vs luminance characteristics and in FIG. 10 power efficiency vs luminance characteristics of various OLED's having a structure stacking sequentially: Substrate/conductive anode layer/C60 (3 nm)/CuPc(15)/NPB (45 nm)/Alq (25 nm)/ETL (15 nm)/LiF(1 nm)/Al(100 nm). Here two conductive anode films were selected; indium-tin-oxides (ITO) (120 nm), and the same ITO coated with 3 nm thick Ag. As hole transport from an anode layer to C60 layer is determined by the surface work function of the layer, we consider the 3 nm thick metal as an individual functional conductive anode layer. The 15 nm thick ETL was selected from C60 and Alq, respectively.

Figure 11:
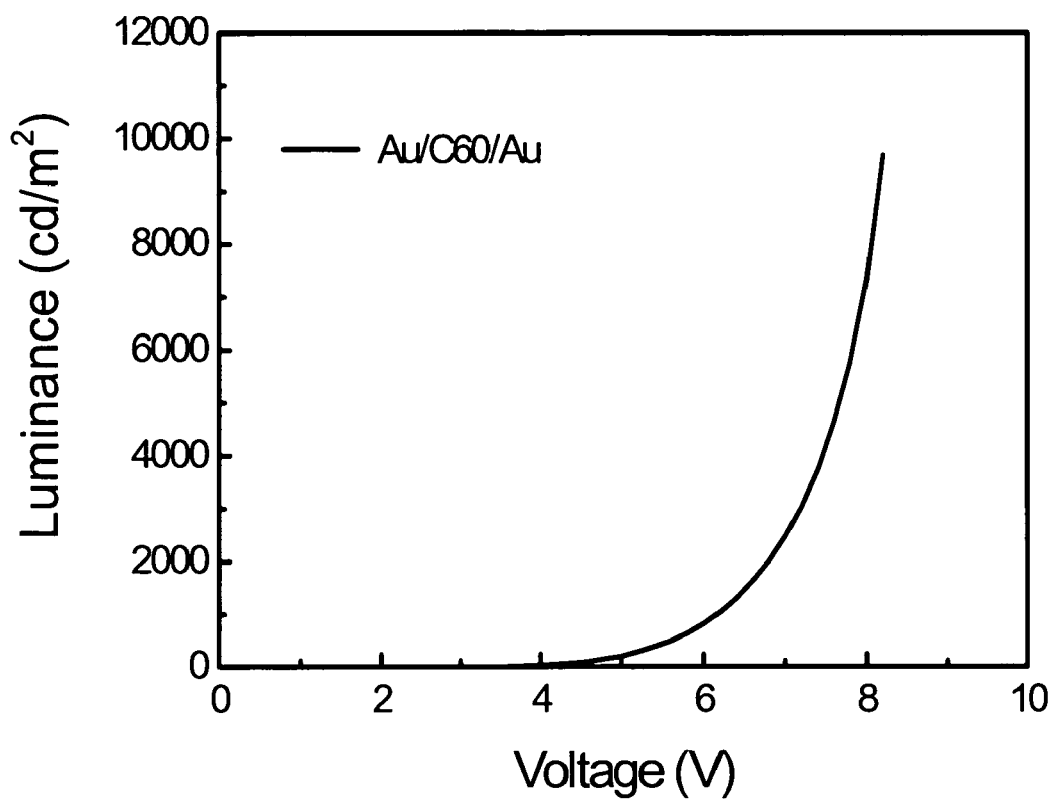
FIG. 11 shows plots of luminance versus voltage characteristics of an organic EL device constructed according to FIG. 2 in which the tri-layered hole injection structure is Au(15 nm)/C60(5 nm)/Au(5 nm)
Figure 12:
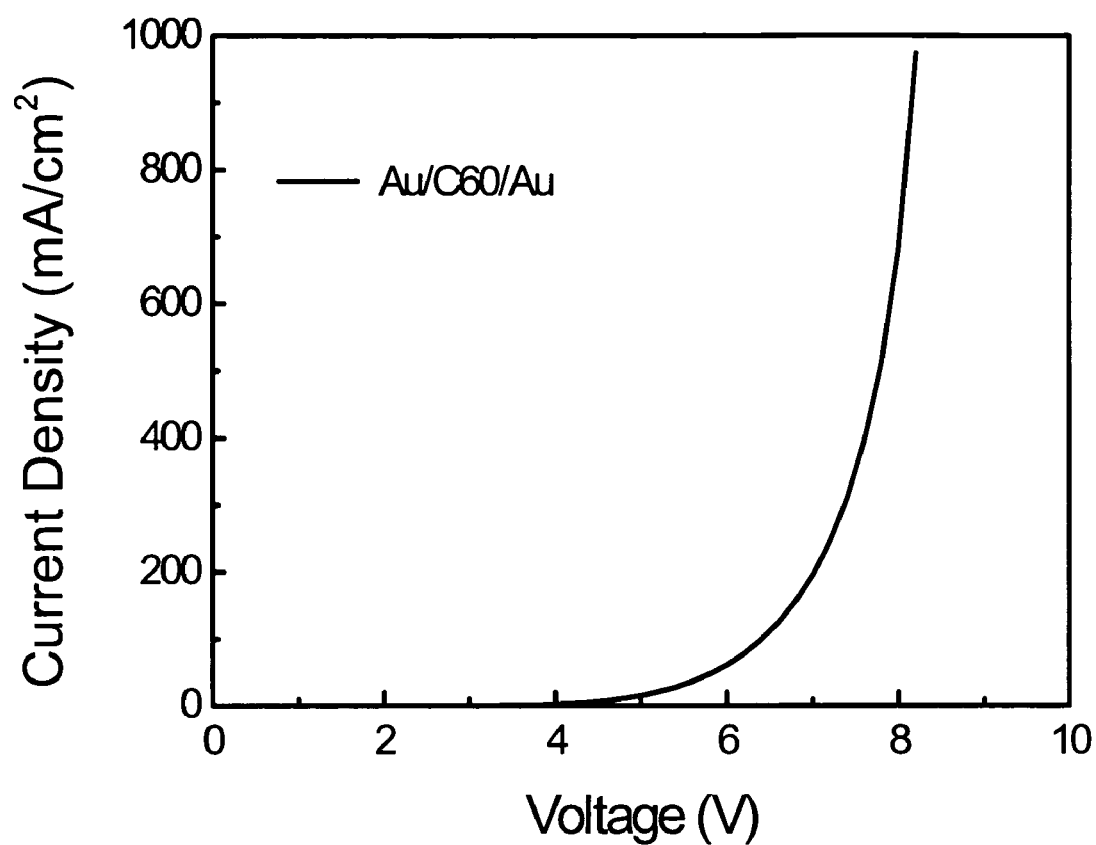
FIG. 12 shows plots of luminance versus voltage characteristics of an organic EL device constructed according to FIG. 2 in which the tri-layered hole injection structure is Au(15 nm)/C60(5 nm)/Au(5 nm)

Shown in FIG. 11 is luminance vs voltage characteristics and in FIG. 12 is current density vs voltage characteristics of an OLED having a structure stacking sequentially: Substrate/Au(150 nm)/C60(5 nm)/Au(5 nm)/CuPc(25)/NPB (45 nm)/Alq (40 nm)/LiF(1.5 nm)/Al(100 nm).

ELECTROLUMINESCENT DEVICE EXAMPLE 3

Figure 13:
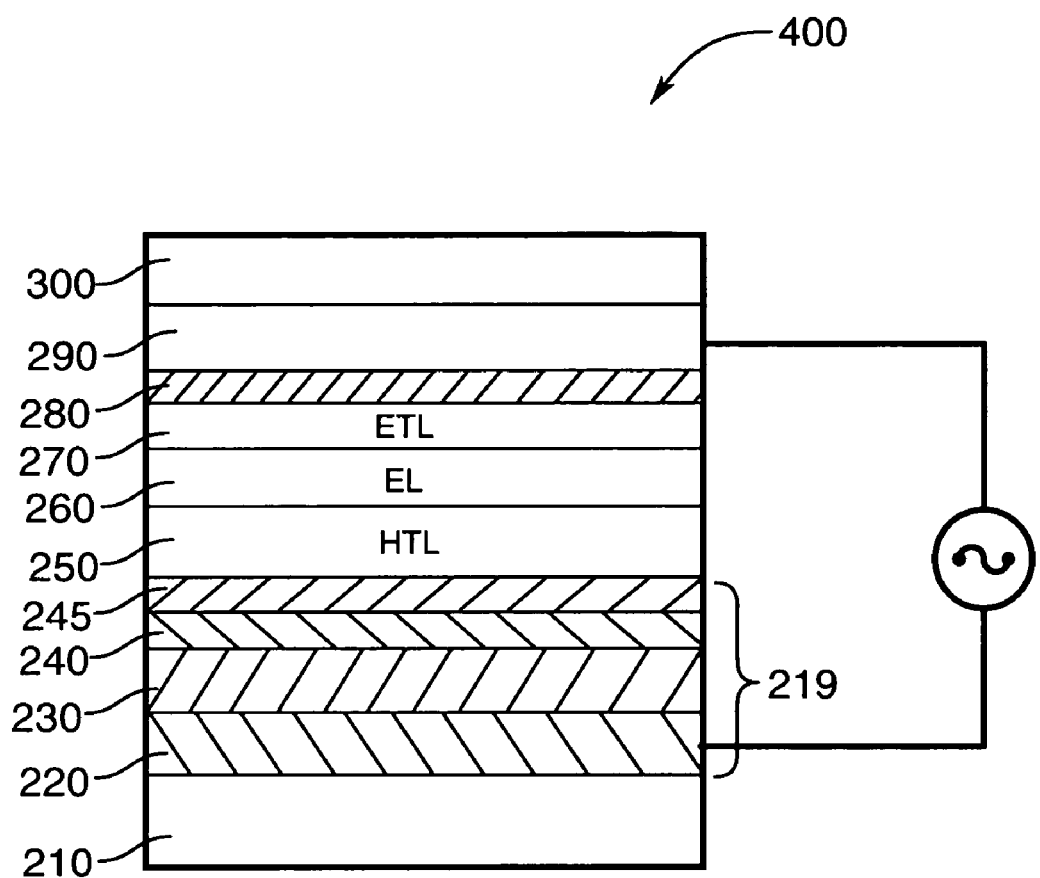
FIG. 13 is a sectional view of a light-emitting device having a four-layered hole injection structure produced in accordance with the present invention.

Referring to FIG. 13, an EL device 400 has been constructed to integrate a four-layered fullerene-containing hole injection structure into a typical small organic molecule based device of the type disclosed in U.S. Pat. No. 4,356,429. The device 400 includes an electrically passive film or a substrate 210, a four-layer hole injection structure 219 which includes four layers 220/230/240/245 inclusive with layer 220 located directly on substrate 210, a hole transport layer 250 on layer 245, a light emissive (EL) or light-emission layer 260 on layer 250 capable of emitting light produced in the hole transport layer 250, an electron transport layer 270 on the light-emission layer 260, an outer conductive cathode layer 290 and an interfacial contact layer 280 sandwiched between electron transport layer 270 and cathode layer 290 which makes good electrical contact with both the electron transport layer 270 and cathode layer 290. A layer 300 is located on cathode layer 290 and may be an electrically passive film or a substrate.

Substrate 210 may be a glass or alternatively it could be made of any material capable of providing mechanical support to thin films. It could be coated with functional thin-film transistors which may be used as electrical drivers capable of providing modulated electrical current through device 400. Substrate 210 may be optically transparent for light emitted from the light emissive layer 260. Alternatively, layers 280, 290 and 300 may be made of suitable materials and thickness to ensure light is coupled out of the light emissive layer 260 through these layers.

Conductive anode layer 220 is connected to external circuit for hole injection when a positive bias is applied and it may be, for example, made of indium tin oxide (ITO). Electrode layer 220 may also be any other metal or alloy with a high work function. For example, anode layer 220 may be selected from high work function conducting materials including $SnO_2$, Ni, Cr, Ag, Pt, Au, p++ semiconductors (c-Si, a-Si, a-Si:H, poly-silicon).

Layer 230 is fullerene layer with a preferred thickness 1-20 nm. It may be made of C60, C70, higher fullerenes or mixtures thereof.

Layer 240 is metal layer and has a preferred thickness 2-20 nm. It may be selected from high work function metals with good optical transparency in the visible spectrum and it may be Au, Ag or Cu.

Layer 245 is fullerene layer with a preferred thickness 1-20 nm. It may be made of C60, C70, higher fullerenes or mixtures thereof.

Light emitting device 400 may include an energy matching layer located between the third hole injection layer 245 and the hole transport layer 250. This energy matching layer is preferably made of organic molecules having a glass transition temperature higher than about 70° C. and a highest occupied molecular orbital (HOMO) energy level between about 4.5 eV and about 6.5 eV.

In a preferred embodiment the organic molecules are metal phthalocyanines, and a particularly preferred metal phthalocynine is copper phthalocyanine (CuPc).

Hole transport layer (HTL) 250 is preferably made of an organic material such as, but not limited to NPB which is commonly used as the HTL, and may have a thickness of about, but not limited to, 50 nm. It could also be any other one or more layers of organic or polymer materials capable of transporting holes and having a thickness range from about 10 nm to about 300 nm as disclosed with respect to device 10 in FIG. 1. The hole-transport layer 250 may also be comprised of any of the other materials disclosed above with respect to layer 50 in device 10 of FIG. 1.

Light emissive or light-emission layer 260 may be an organic electroluminescence layer comprised of, for example, tris-(8-hydroxyquinoline) aluminum (Alq) and may have a thickness of 25 nm. It could also be a layer of an organic compound capable of emitting different colors and having a thickness in the range from about 10 nm to about 100 nm. Other suitable materials useful for the light emission-layer include any of those discussed with respect to layer 60 in device 10 of FIG. 1.

The electroluminescent layer 260 region can also include one or more layers containing one or a mixture of two or more of fluorescent and phosphorescent materials including small molecules and polymers. For example, the active light-emission layer 260 may be comprised of those materials discussed above with respect to layers 60 in device 10 of FIG. 1 or layer 160 of device 300 in FIG. 2.

Electron transport layer 270 is preferably having a thickness range from about 1 nm to about 300 nm, and more preferably from about 5 nm to 50 nm. It may be selected from electron transport materials such as small organic molecule such as Alq, the same as in devices 10 and 300.

The interfacial layer 280 which makes contact with electron transport layer 270 is the same as layer 80 or 180 discussed above with respect to devices 10 and 300, and is preferably made of a bi-layer of 1 nm LiF and Al but may be made using any low work function metals and alloys or mixtures such as Ca, Mg, Mg:Ag and Li:Al to mention just a few.

Cathode layer 290 may be the same as layers 90 or 190 discussed above with respect to devices 10 and 300, and is preferably aluminum (Al) and that which has a thickness of 100 nm.

The present invention provides a hybrid light-emitting device which uses a fullerene-containing a four-layer hole injection structure for hole injection.

Figure 14:
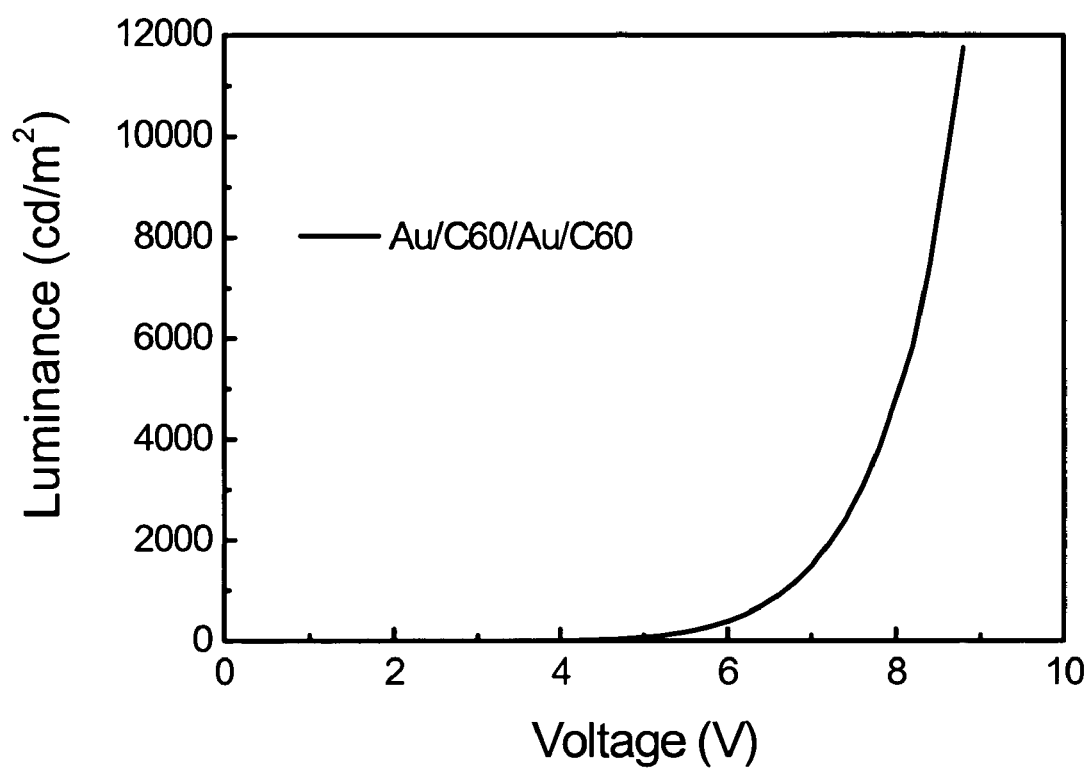
FIG. 14 shows plots of luminance versus voltage characteristics of an organic EL device constructed according to FIG. 13 in which the 4-layered hole injection structure is Au(15 nm)/C60(5 nm)/Au(5 nm)/C60(3 nm)
Figure 15:
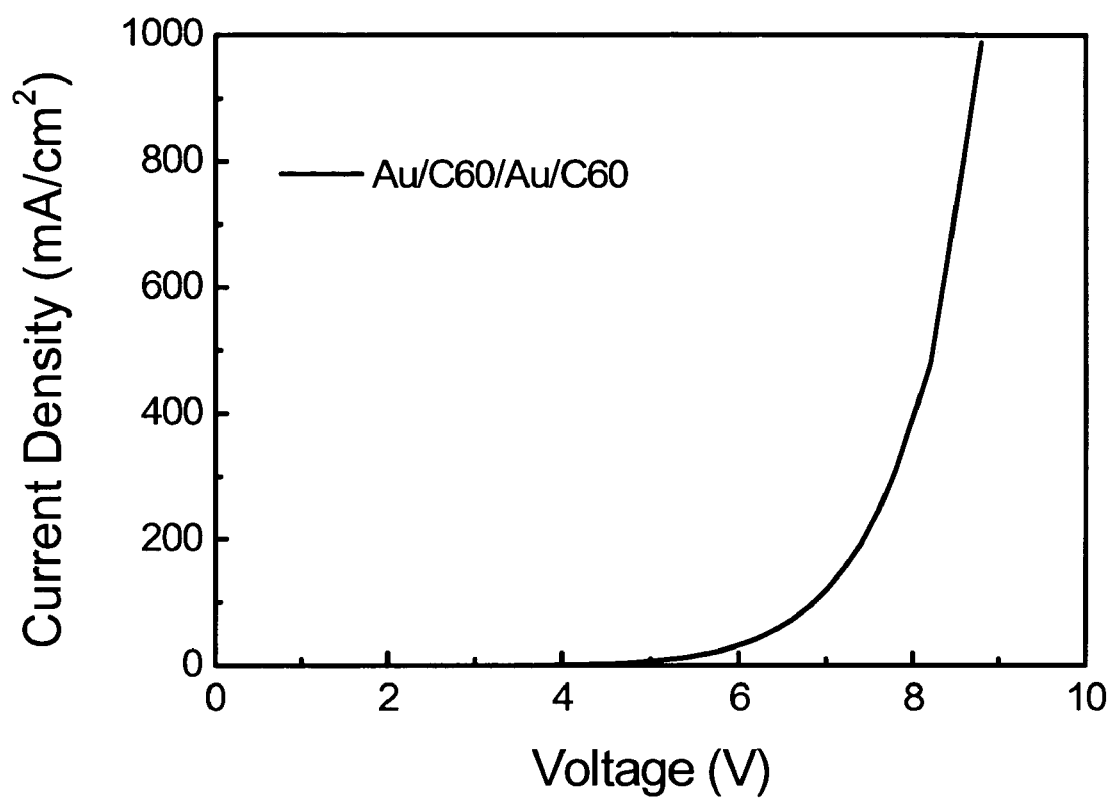
FIG. 15 shows plots of luminance versus voltage characteristics of an organic EL device constructed according to FIG. 13 in which the 4-layered hole injection structure is Au(15 nm)/C60(5 nm)/Au(5 nm)/C60(3 nm).

Shown in FIG. 14 is luminance versus voltage characteristics and in FIG. 15 is current density vs voltage characteristics of an OLED having a structure stacking sequentially: Substrate/Au(150 nm)/C60(5 nm)/Au(5 nm)/C60 (3 nm)/CuPc(25)/NPB (45 nm)/Alq (40 nm)/LiF(1.5 nm)/Al (100 nm). The device performance shown here is similar to the state-of-the-art device using conventional hole injection anode structure, i.e., ITO/CuPc (X. D. Feng, C. J. Huang, V. Lui, R. S. Khangura, and Z. H. Lu, Applied Physics Letters, Vol. 86, p143511 (2005)).

Because of its high optical transparency and moderate electrical conductivity, Indium Tin Oxide (ITO) has been used exclusively as a standard anode layer despite many of its shortcomings. For example, its work function is known to vary dramatically depending on surface treatment method and conditions (H. Y. Yu, X. D. Feng, D. Grozea, Z. H. Lu, R. N. S. Sodhi, A-M. Hor and H. Aziz, Appl. Phys. Lett. 78, 2595 (2001). It has been reported that various species from the ITO will diffuse into the organic semiconductor layers and consequently lead to a degradation in device performance (M. P. de Jong, L. J. van IJzendoom, and M. J. A. de Voigt, Appl. Phys. Lett. 77, 2255 (2000)). The use of ITO is also limited because of its deposition and post-deposition anneal require temperatures>200° C., which may, for example, exclude the use of flexible plastic substrate in a roll-to-roll type fabrication. The resisivity of the ITO is $10^{-4}$ Ω·cm, which is two orders of magnitude higher than that of typical metals. This leads to a significant power loss and non-uniformity in light output of large size display or diodes. Thus, the alternative hole injection structures using a metal anode, as is disclosed herein in example 3 and example 4, is highly advantageous for OLEDs in applications which require high-power, large area and ease in manufacturing.

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A light-emitting device with a hole injection structure, comprising:
   a) a substrate;
   b) a hole injection structure including
      an electrically conductive layer defining an anode on said substrate;
      a first hole injection layer comprising fullerenes on said electrically conductive layer;
      a second hole injection layer comprising a metal on said first hole injection layer;
      a third hole injection layer located on said second hole injection layer comprising fullerenes;
   c) a hole transport layer on said third hole injection layer;
   d) a layer of an electroluminescent material on the hole transport layer;
   e) an electron transport layer on said layer of an electroluminescent material; and
   f) an electrically conductive layer defining a cathode electrode layer on the electron transport layer.

2. The light-emitting device of claim 1 wherein said metal is selected from the group consisting of high work function noble metals.

3. The light-emitting device of claim 2 wherein said metal is selected from the group consisting of Au, Ag and Cu.

4. The light-emitting device of claim 1 including an interfacial layer interposed between the electron transport layer and said electrically conductive layer defining a cathode electrode, said interfacial layer comprising a LiF compound having a thickness from about 0.2 nm to about 10 nm.

5. The light-emitting device of claim 1 wherein said electrically conductive layer defining an anode is selected from materials with work function larger than about 4.5 eV.

6. The light-emitting device of claim 5 wherein said high work function material is indium tin oxide (ITO).

7. The light-emitting device according to claim 5 wherein said high work function material is selected from the group consisting of transition metals and noble metals.

8. The light-emitting device according to claim 7 wherein said transition metals are selected from the group consisting of Ni, Cr, Mo, W, Zr, Ti, and Fe.

9. The light-emitting device according to claim 7 wherein said noble metals are Ag and Au.

10. The light-emitting device of claim 1 wherein said electrically conductive layer defining an anode on said substrate includes a layer of an electrically conducting metal oxide located on the substrate, and a layer of a high work function metal located between said layer of an electrically conducting metal oxide and said first hole injection layer comprising fullerenes.

11. The light-emitting device of claim 10 wherein said electrically conducting metal oxide is indium tin oxide (ITO).

12. The light-emitting device according to claim 10 wherein said high work function material is selected from the group consisting of noble metals.

13. The light-emitting device according to claim 12 wherein said noble metals are Ag and Au.

14. The light-emitting device of claim 1 wherein said fullerenes in the first hole injection layer are selected from the group consisting of C60, C70 and combinations thereof.

15. The light-emitting device of claim 1 wherein said fullerenes in the third hole injection layer are selected from the group consisting of C60, C70 and combinations thereof.

16. The light-emitting device of claim 1 wherein said electron transport layer includes fullerenes.

17. The tight-emitting device of claim 16 wherein said fullerenes in the electron transport layer are selected from the group consisting of C60, C70 and combinations thereof.

18. The light-emitting device of claim 1 wherein said first hole injection layer comprising fullerenes has a thickness in a range from about 1 nm to about 20 nm.

19. The light-emitting device of claim 1 wherein said third hole injection layer comprising fullerenes has a thickness in a range from about 1 nm to about 20 nm.

20. The light-emitting device of claim 1 wherein said electrically conductive layer defining a cathode electrode layer is aluminum.

21. The light-emitting device of claim 1 wherein said electron transport layer includes Tris (8-hydroxyquinolinato) aluminum (Alq).

22. The light-emitting device of claim 1 wherein said hole transport layer includes N, N/-bis (1-naphthyl)-N, N/-diphenyl-1, 1/-biphenyl-4, 4/-diamine (NPB).

23. The light-emitting device of claim 1 wherein said second hole injection layer comprising a metal has a thickness in a range from about 2 nm to about 30 nm.

24. The light-emitting device of claim 1 including an energy matching layer located between said third hole injection layer and said hole transport layer, wherein said energy matching layer includes organic molecules selected from the group consisting of organic molecules with a glass transition temperature higher than about 70° C. and a highest occupied molecular orbital (HOMO) energy level between about 4.5 eV and about 6.5 eV.

25. The light-emitting device of claim 24 wherein said organic molecules are selected from the group consisting of metal phthalocyanines.

26. The light-emitting device of claim 25 wherein said metal phthalocynine is copper phthalocyanine (CuPc).

27. The light-emitting device of claim 1 wherein said electroluminescent material is selected from the group consisting of tris-(8-hydroxyquinoline) aluminum (Alq), electroluminescent organic compounds and electroluminescent conjugated polymers, and rare earth metal, actinide or transition metal organic complexes.

28. The light-emitting device of claim 1 including a power supply for applying a voltage across the anode electrode layer and the cathode electrode, wherein when a threshold voltage is applied across said light emitting device, holes are injected from said hole injection structure through said hole transport layer and into said electroluminescent layer 160 where they recombine with electrons injected from said cathode electrode layer through said electron transport layer, and upon recombination of the holes and electrons, light is emitted from said electroluminescent layer.

* * * * *

UNITED STATES PATENT AND TRADEMARK OFFICE
CERTIFICATE OF CORRECTION

| | | |
|---|---|---|
| PATENT NO. | : 7,358,538 B2 | Page 1 of 1 |
| APPLICATION NO. | : 11/260469 | |
| DATED | : April 15, 2008 | |
| INVENTOR(S) | : Lu et al. | |

It is certified that error appears in the above-identified patent and that said Letters Patent is hereby corrected as shown below:

On title page item [75]
Inventor Han's name should be corrected to read: --Sijin Han--.
The city for Inventor Han should be corrected to read: --North York--.

Signed and Sealed this

Twenty-fourth Day of June, 2008

JON W. DUDAS
*Director of the United States Patent and Trademark Office*